(12) United States Patent
Lacap

(10) Patent No.: US 11,584,638 B2
(45) Date of Patent: Feb. 21, 2023

(54) REDUCING DELAMINATION IN SENSOR PACKAGE

(71) Applicant: INVENSENSE, INC., San Jose, CA (US)

(72) Inventor: Efren Lacap, Morgan Hill, CA (US)

(73) Assignee: INVENSENSE, INC., San Jose, CA (US)

( * ) Notice: Subject to any disclaimer, the term of this patent is extended or adjusted under 35 U.S.C. 154(b) by 37 days.

(21) Appl. No.: 16/943,445

(22) Filed: Jul. 30, 2020

(65) Prior Publication Data
US 2022/0033252 A1    Feb. 3, 2022

(51) Int. Cl.
*H01L 29/82*    (2006.01)
*B81B 7/00*    (2006.01)
*B81C 1/00*    (2006.01)

(52) U.S. Cl.
CPC ........ *B81B 7/0048* (2013.01); *B81C 1/00325* (2013.01); *B81B 2201/0242* (2013.01); *B81B 2207/012* (2013.01); *B81B 2207/07* (2013.01); *B81B 2207/098* (2013.01)

(58) Field of Classification Search
CPC ...................... B81B 7/0048; B81B 2201/0242
See application file for complete search history.

(56) References Cited

U.S. PATENT DOCUMENTS

| | | |
|---|---|---|
| 8,933,520 B1 | 1/2015 | Jergovic et al. |
| 2003/0111717 A1 | 6/2003 | Ito et al. |
| 2016/0282212 A1 | 9/2016 | Beer et al. |
| 2017/0197823 A1* | 7/2017 | Wachtler ............... B81B 7/0054 |
| 2020/0212166 A1 | 7/2020 | Cook et al. |

FOREIGN PATENT DOCUMENTS

| | | |
|---|---|---|
| CN | 202297105 U | 7/2012 |
| CN | 111128943 A | 5/2020 |
| EP | 3026696 A1 | 6/2016 |

(Continued)

OTHER PUBLICATIONS

International Search Report and Written Opinion for International Application No. PCT/US2021/02719 dated Jul. 29, 2021, 16 pages.

(Continued)

*Primary Examiner* — Samuel A Gebremariam
(74) *Attorney, Agent, or Firm* — Amin, Turocy & Watson, LLP

(57) ABSTRACT

A sensor can comprise a sensor die with a first sensor surface and a second sensor surface opposite to the first sensor surface. The sensor can further comprise a die pad component with a first pad surface and a second pad surface opposite to the first pad surface, wherein the sensor die is vertically stacked with the die pad component, with the second sensor surface oriented toward the first pad surface. The sensor can further comprise a lead frame component with a first frame surface and a second frame surface opposite to the first frame surface, the die pad component is vertically stacked with the lead frame component, wherein the second pad surface is oriented toward the first frame surface, the second pad surface is isolated from the second frame surface, and the lead frame component is electrically connected to the sensor die.

19 Claims, 10 Drawing Sheets

(56) References Cited

FOREIGN PATENT DOCUMENTS

TW   200847418 A   12/2008
WO   2019124417 A1   6/2019

OTHER PUBLICATIONS

Wang Hu et al: "The process development and reliability study of low cost Area Array QFN packaging technology", 2014 15th International Conference on Electronic Packaging Technology, IEEE, Aug. 12, 2014 (Aug. 12, 2014), pp. 105-108, XP032658820, DOI: 10.1109/ICEPT.2014.6922612 [retrieved on Oct. 13, 2014] A figure 1 section "II. Process development".
Office Action for Taiwan Patent Application No. 110114172 dated Jan. 13, 2022, 9 pages (with translation).

\* cited by examiner

REDUCING DELAMINATION IN SENSOR PACKAGE

TECHNICAL FIELD

The present invention relates to micro-electrical-mechanical systems (MEMS) devices, and particularly to packaging for MEMS devices.

BACKGROUND

Packaging integrated circuit (IC) components can facilitate use of the integrated circuit component, e.g., by providing a container for components of the integrated circuit. In some implementations, this use can be facilitated by the packaging providing an integrated arrangement of inputs and outputs, as well as different ways to keep packaged components together and functioning, e.g., IC packages can have structural elements that maintain the arrangement of packaged components, and facilitate the dissipation of heat generated by the components.

Problems can occur however, when the requirements of modern IC components are not provided by IC packaging, e.g., in some implementations, micro-electrical-mechanical systems (MEMS) can operate best under conditions different from traditional IC components. In some circumstances these problems can result in degradation or failure of the IC component package. Consequently, conventional approaches to packaging IC components can have some drawbacks, some of which may be noted with reference to the various embodiments described herein.

SUMMARY

The following presents a simplified summary of one or more of the embodiments of the present invention in order to provide a basic understanding of the embodiments. This summary is not an extensive overview of the embodiments described herein, e.g., it is intended to neither identify key or critical elements of the embodiments nor delineate any scope of embodiments or the claims. A purpose of this summary is to present some concepts of the embodiments in a simplified form as a prelude to the more detailed description that is presented later. It will also be appreciated that the detailed description may include additional or alternative embodiments beyond those described in the Summary section.

Generally speaking, the present disclosure recognizes and addresses, in at least certain embodiments, the issue of reducing delamination of packaged IC components. For example, in one or more embodiments, a sensor can comprise a sensor die with a first sensor surface and a second sensor surface opposite to the first sensor surface. The sensor can further comprise a die pad component with a first pad surface and a second pad surface opposite to the first pad surface, wherein the sensor die can be vertically stacked with the die pad component, with the second sensor surface oriented toward the first pad surface. The sensor can further comprise a lead frame component with a first frame surface and a second frame surface opposite to the first frame surface, the die pad component can be vertically stacked with the lead frame component, wherein the second pad surface can be oriented toward the first frame surface, the second pad surface can be isolated from the second frame surface, and the lead frame component can be electrically connected to the sensor die.

In the sensor, the second pad surface can be isolated from the second frame surface based on being at least partially encapsulated in a molding compound. In the sensor, the second pad surface can be isolated from the second frame surface based on the second pad surface not being exposed outside of the lead frame component. In the sensor, the second pad surface can be isolated from the second frame surface to a degree selected based on an isolation required to prevent delamination of the die pad component.

In the sensor, the sensor die can include a MEMS component comprising a first MEMS surface and a second MEMS surface opposite to the first MEMS surface, wherein the first sensor surface comprises the first MEMS surface. The sensor can further include an application-specific integrated circuit (ASIC) component comprising a first ASIC surface and a second ASIC surface opposite to the first ASIC surface, wherein the MEMS component can be vertically stacked with the MEMS component, with the second MEMS surface oriented toward the first ASIC surface, and wherein the second sensor surface comprises the second ASIC surface. In the sensor, the MEMS component can be a MEMS accelerometer or a MEMS gyroscope.

In the sensor, the second frame surface can be for orientating towards, and mounting to, a circuit board. In the sensor, the second pad surface can be thermally isolated from the second frame surface. In the sensor, the second pad surface can be moisture isolated from the second frame surface. In the sensor, the second pad surface can be electrically isolated from the second frame surface. The sensor can further include bond wires electrically coupling the sensor component to the lead frame component. In the sensor, the sensor component and the die pad component can be packaged in a circuit package by the lead frame component. In the sensor, the circuit package can be a quad-flat no leads package.

In the sensor, the sensor component and the die pad component can be mounted to the lead frame component by a material comprising a molding compound. In the sensor, the molding compound mounts the die pad component to the lead frame component by factors comprising disposal of the molding compound between the second pad surface and the first frame surface, and wherein the second pad surface can be isolated from the second frame surface based on the molding compound.

In the sensor, the die pad component can be removed from the sensor based on an opening in the lead frame component and an etching process, with the removal of the die pad component exposing the second sensor surface to an outside of the sensor. In the sensor, the die pad component can be encapsulated by the lead frame component, resulting in an unexposed die pad component. In the sensor, the second pad surface can be isolated from the second frame surface to reduce exposure of the die pad component to external influences, such as humidity and temperature. The sensor can further include an adhesive layer disposed between the second sensor surface and the first pad surface, resulting in the sensor die being affixed to the die pad component with the adhesive layer.

A method of reducing delamination of components of IC packages is also described herein. This method can include providing a sensor die comprising a first sensor surface and a second sensor surface opposite to the first sensor surface. The method can further include providing a lead frame packaging component comprising a first frame surface and a second frame surface opposite to the first sensor surface. Further, the method can include affixing the second sensor surface to a first pad surface of a die pad component, wherein the first pad surface can be opposite a second pad surface of the die pad component, and wherein the second pad surface can be affixed to the first frame surface without being exposed through the lead frame packaging component.

Another method described herein can include providing a sensor die, and mounting the sensor die to a die pad component, with the die pad component being embedded to be exposed from an integrated circuit packaging component as an exposed die pad component. The method can further include removing the exposed die pad component from being embedded to be exposed from the integrated circuit packaging component.

In some instances, the method can include removing the exposed die pad component comprises removing the exposed die pad component by an etching process after the mounting the sensor die to the die pad component. Also, the mounting the sensor die to the die pad component can be based on a bonding layer disposed between the second sensor surface and the first pad surface, resulting in the sensor die being affixed to the die pad component with the bonding layer. In the method, the bonding layer can be a die attached film adhesive, and the removing of the exposed die pad component can result in the bonding layer being exposed.

The following description and the annexed drawings set forth in detail certain illustrative aspects of the disclosed subject matter. These aspects are indicative, however, of but a few of the various ways in which the principles of the disclosed subject matter may be employed, and the disclosed subject matter is intended to include all such aspects and their equivalents. Other advantages and distinctive features of the disclosed subject matter will become apparent from the following detailed description of the disclosed subject matter when considered in conjunction with the drawings.

BRIEF DESCRIPTION OF THE DRAWINGS

Non-limiting embodiments of the subject disclosure are described with reference to the following figures, wherein like reference numerals refer to like parts throughout the various views unless otherwise specified.

DETAILED DESCRIPTION

Aspects of the subject disclosure will now be described more fully hereinafter with reference to the accompanying drawings in which example embodiments are shown. In the following description, for purposes of explanation, numerous specific details are set forth in order to provide a thorough understanding of the various embodiments. However, the subject disclosure may be embodied in many different forms and should not be construed as limited to the example embodiments set forth herein.

Reference throughout this specification to "one embodiment," "an embodiment," or "one or more embodiments" can be an indication that a particular feature, structure, or characteristic described in connection with the embodiment is included in at least one embodiment. Thus, the appearances of the phrase "in one embodiment," "in an embodiment," and "in one or more embodiments" in various places throughout this specification are not necessarily all referring to the same embodiment. Furthermore, the particular features, structures, or characteristics may be combined in any suitable manner in one or more embodiments.

Generally speaking, one or more embodiments discussed herein can, in some circumstances, reduce the occurrence of certain types of structural failure of an IC package. An example type of structural failure the can be reduced by one or more embodiments is the delamination of surfaces inside the IC package based on thermal stresses. As described below, one or more embodiments can, in some circumstances beneficially reduce the likelihood of delamination of an IC package.

It should be noted that, notwithstanding the examples described herein, one or more embodiments can improve the operation of various other types of IC packaging, e.g., different non-limiting techniques described and suggested by the description of the present disclosure can apply to packaging integrated circuits with a variety of different components and structures.

Figure 1:
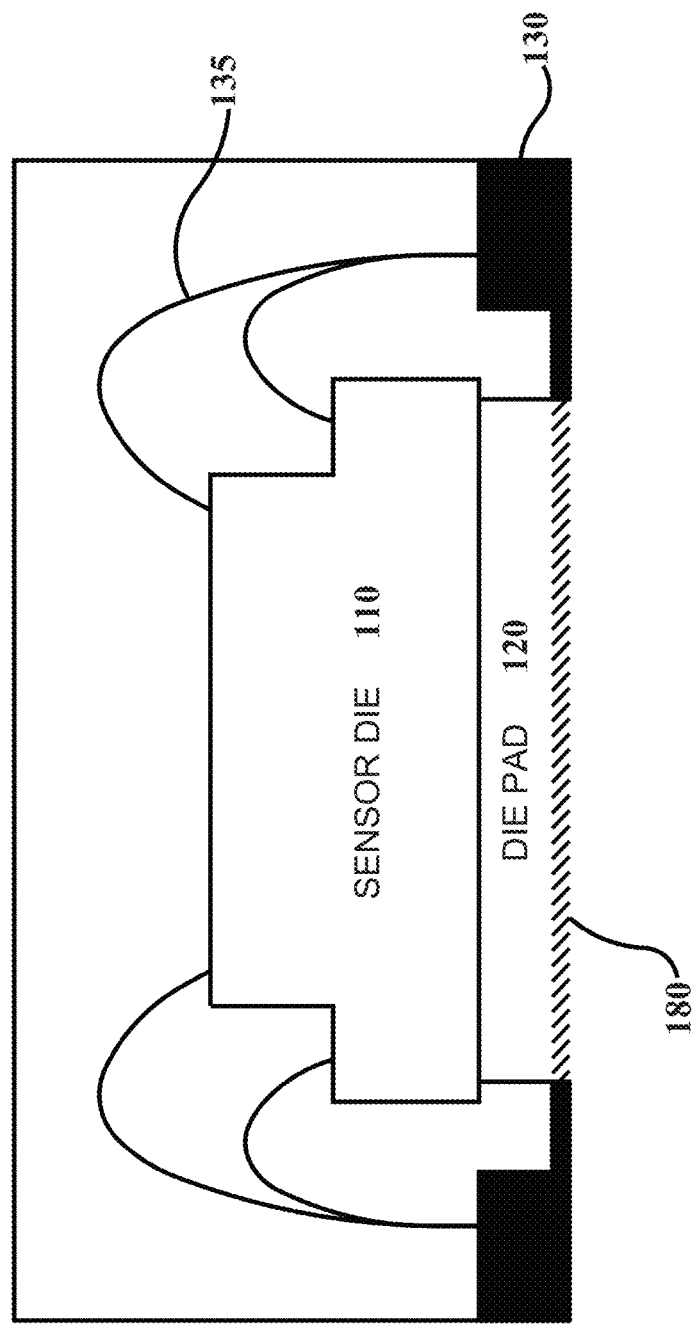
FIGS. 1 and 2 illustrate different views of the components of an example system that can facilitate packaging an IC sensor, in accordance with one or more embodiments.
Figure 2:
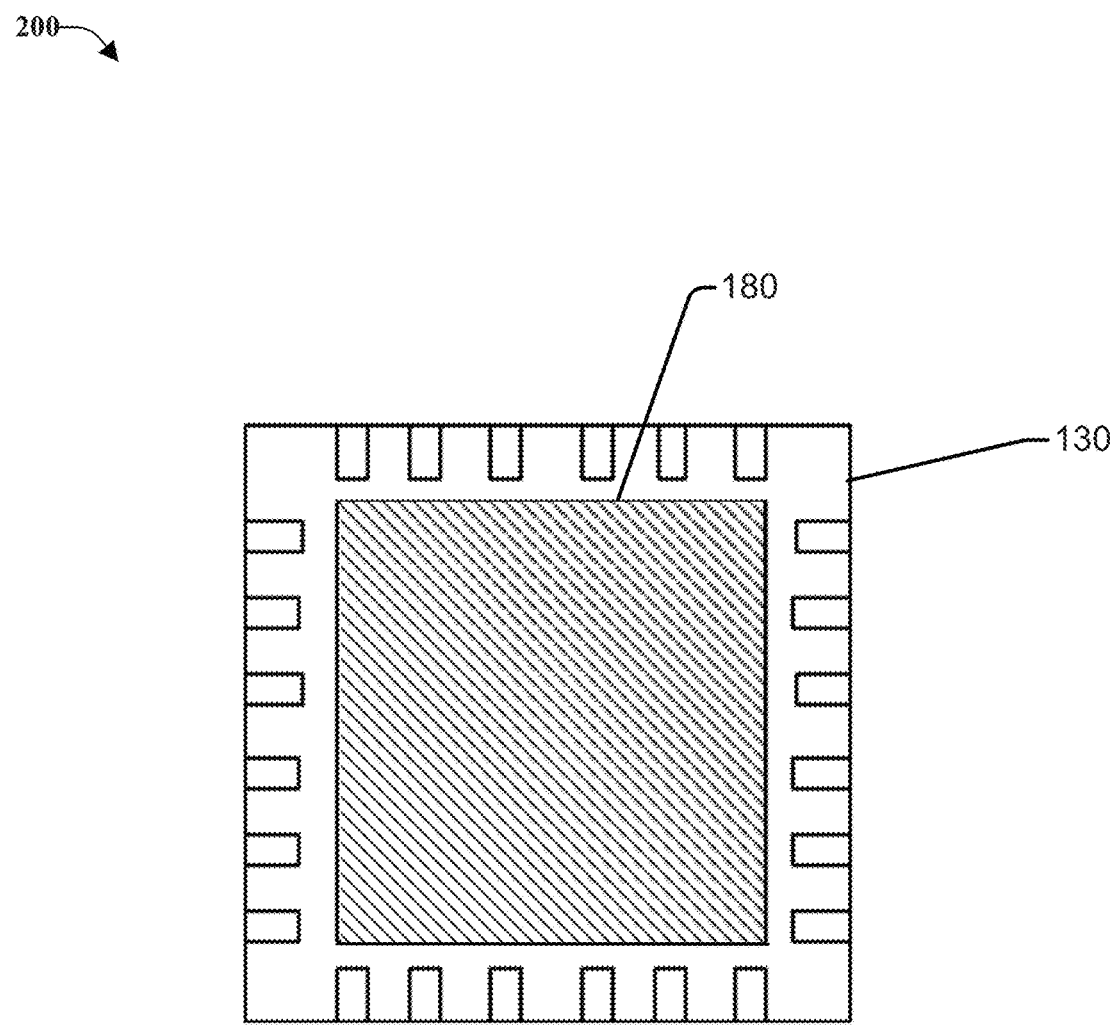

FIGS. 1 and 2 illustrate different views of the components of example system 100 that can facilitate packaging an IC sensor, in accordance with one or more embodiments, with FIG. 1 illustrating a non-limiting cross-sectional diagram, and FIG. 2 depicting a non-limiting example underside view 200 of example system 100, in accordance with one or more embodiments. For purposes of brevity, description of like elements and/or processes employed in other embodiments is omitted.

As depicted, system 100 can include sensor die 110 and lead frame 130, which includes die pad component 120 and wire leads 135. In this example, sensor die 110 is vertically stacked on die pad component 120 and wire leads 135 communicatively couple lead frame 130 to different parts of sensor die 110.

In the example embodiments depicted in FIG. 1, die pad component 120 is incorporated in lead frame 130 so as to reduce the exposure of die pad component 120 and sensor die 110 mounted thereto, to thermal stresses. In some implementations of lead frame 130, die pad component 120 can be embedded in lead frame 130 so as to expose die pad component 120 to the outside of lead frame 130, e.g., at die pad exposure region 180 depicted in FIGS. 1 and 2. In other examples discussed herein, instead of being embedded to be exposed to the outside of lead frame 130, die pad component 120 can be a part of lead frame 130 without being exposed to the outside, e.g., FIGS. 3 and 4 discussed below. In another example, as discussed with FIG. 7 below, die pad component 120 and sensor die 110 can be encapsulated by an epoxy compound, with this compound being disposed between die pad component 120 and lead frame 130.

In yet another example, discussed with FIG. 8 below, lead frame 130 can be utilized in an initial form, with die pad component 120 being embedded so as to be exposed to contact with the outside of lead frame 130, e.g., procured in this way as a conventional part from a supplier of conventional parts. In this example, processes are described with FIG. 8 that can be utilized with one or more embodiments to, after sensor die 110 has been mounted to die pad component 120, remove die pad component 120 from being embedded to be exposed from lead frame 130, e.g., leaving an empty region between sensor die 110 (e.g., encapsulated in epoxy molding material) and external stresses.

It should be noted that the description herein of sensor die 110 is non-limiting, and this IC sensor component can broadly include any sensor dies 110 that can benefit from the packaging approaches described herein. For example, in some implementations, sensor die 110 can be a combination of a MEMS sensor with other enabling components. In another example, sensor die 110 can comprise a MEMS die, and in another example, sensor die 110 can include a MEMS die bonded to a CMOS die. Example sensors that can benefit from different approaches described herein include, but are not limited to, different sensors implemented using MEMS, e.g., a MEMS accelerometer and a MEMS gyroscope. Example components of sensor die 110 are discussed further with FIG. 5 below.

As depicted in FIG. 1, lead frame 130 is an example semiconductor package that can be used with one or more embodiments. A lead frame-based semiconductor device package is the most widely used IC package. Typically, a lead frame can include a chip mount pad (e.g., die pad component 120, also referred to as a die paddle) for attaching the IC die or chip to the lead frame, and a plurality of lead fingers or conductive segments which provide a conductive path between the chip and external circuits.

Like some other semiconductor packages, lead frame 130 can connect (both physically and electrically) silicon dies (e.g., an ASIC and sensor combination) to a printed circuit board (PCB, not shown) using different surface-mounting approaches. In exemplary embodiments, lead frame 130 can be a quad flat no-lead (QFN) semiconductor package that facilitates the ability to view wire leads 135 after assembly.

With respect to the fabrication of the embodiments depicted in FIG. 1, sensor die 110 can be affixed to die pad component 120 using a variety of different approaches, e.g., an adhesive or paste to attach sensor die 110 to die pad component 120 with or without conductivity between the attached components. Another aspect of fabrication includes the attachment of die pad component 120 to lead frame 130.

As would be appreciated by one having skill in the relevant art(s), given the description herein, sensor dies packaged in a way similar to the embodiments of FIG. 1, can in some circumstances, be subject to a delamination between one or more constituent components (e.g., loss of adhesion between sensor die 110 and die pad component 120), as well as delamination between the components and the IC packaging, e.g., between die pad component 120 and lead frame 130. Results of delamination can include, but are not limited to, loss of function of the IC, with or without structural damage to the IC, e.g., a cracking of the IC packaging. As discussed further below, one or more embodiments can reduce the likelihood of IC package delamination, in some circumstances.

It should be noted that, as depicted in FIG. 1, die pad component 120 abuts die pad exposure region 180. Also, as depicted in FIG. 2, die pad exposure region 180 can be enclosed by lead frame 130. As discussed further with figures three through 6 below, one and more embodiments can utilize different materials in die pad exposure region 180, to different effects, e.g., to limit exposure of die pad component 120. Die pad exposure region 180 is depicted in FIG. 2, in part, to identify a region that can correspond to a region opposite die pad component 120, where die pad component 120 can be exposed. In some implementations of lead frame 130, this die pad exposure region 180 can correspond to an opening where die pad component 120 is arranged so as to be exposed at die pad exposure region 180. This arrangement can be employed, for example, to facilitate thermal transfer between die pad component 120 and the environment outside lead frame 130.

One effect of this thermal transfer for some implementations is to beneficially dissipate heat that can develop within lead frame 130. As described below however, some packaged components can have different characteristics than the components for which the die pad exposure region 180 was designed. Because of the different characteristics described below, one or more embodiments can implement a lead frame having a different structure, e.g., a structure that alters aspects of die pad exposure region 180 of lead frame 130 to achieve results including, but not limited to, a change in the thermal transfer between die pad component 120 and the environment outside of lead frame 130, and a reduction in the moisture ingressing into lead frame 130.

Figure 3:
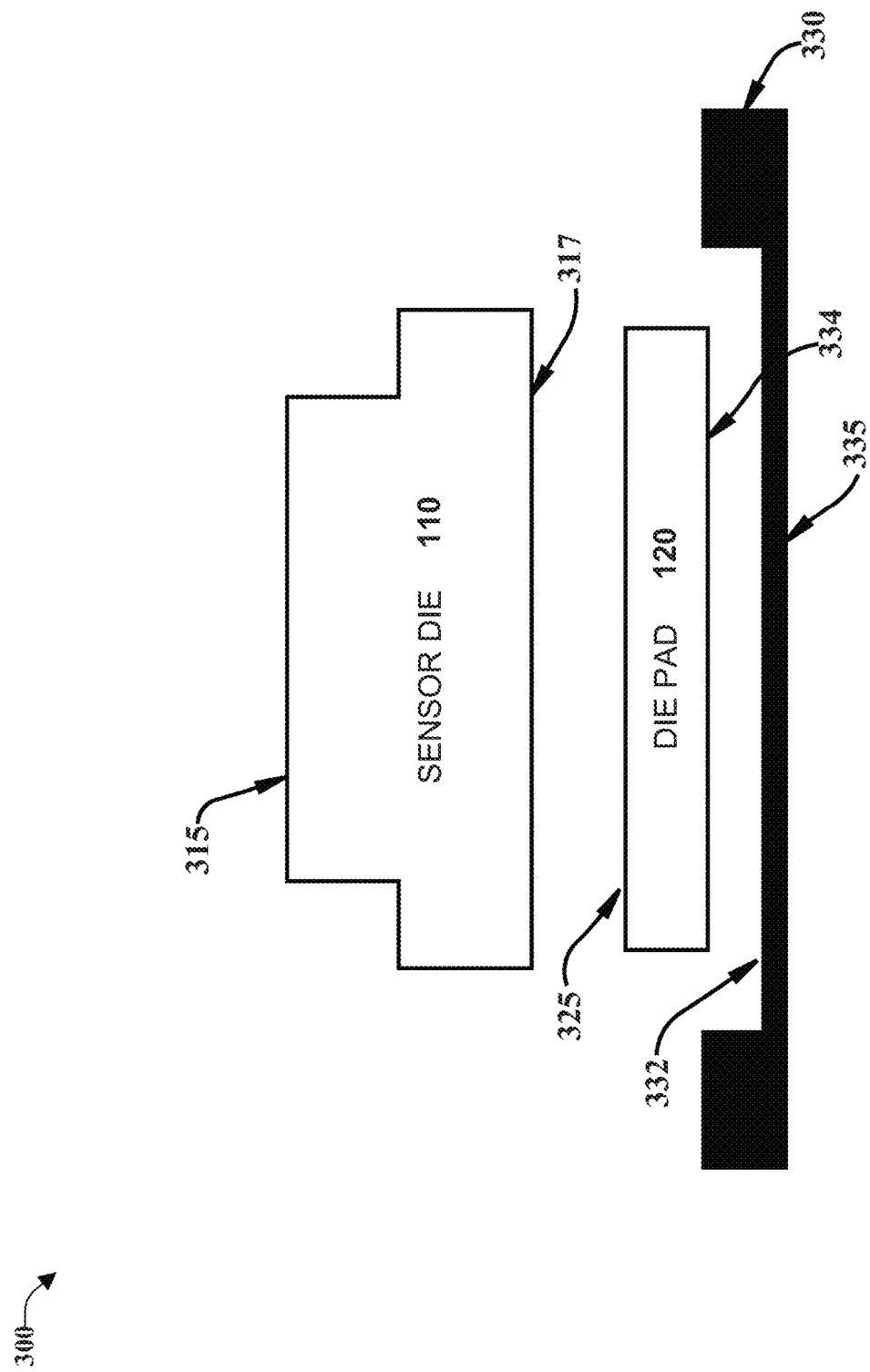
FIGS. 3 and 4 illustrate different views of the components of an example system that can facilitate packaging an IC sensor, in accordance with one or more embodiments.
Figure 4:
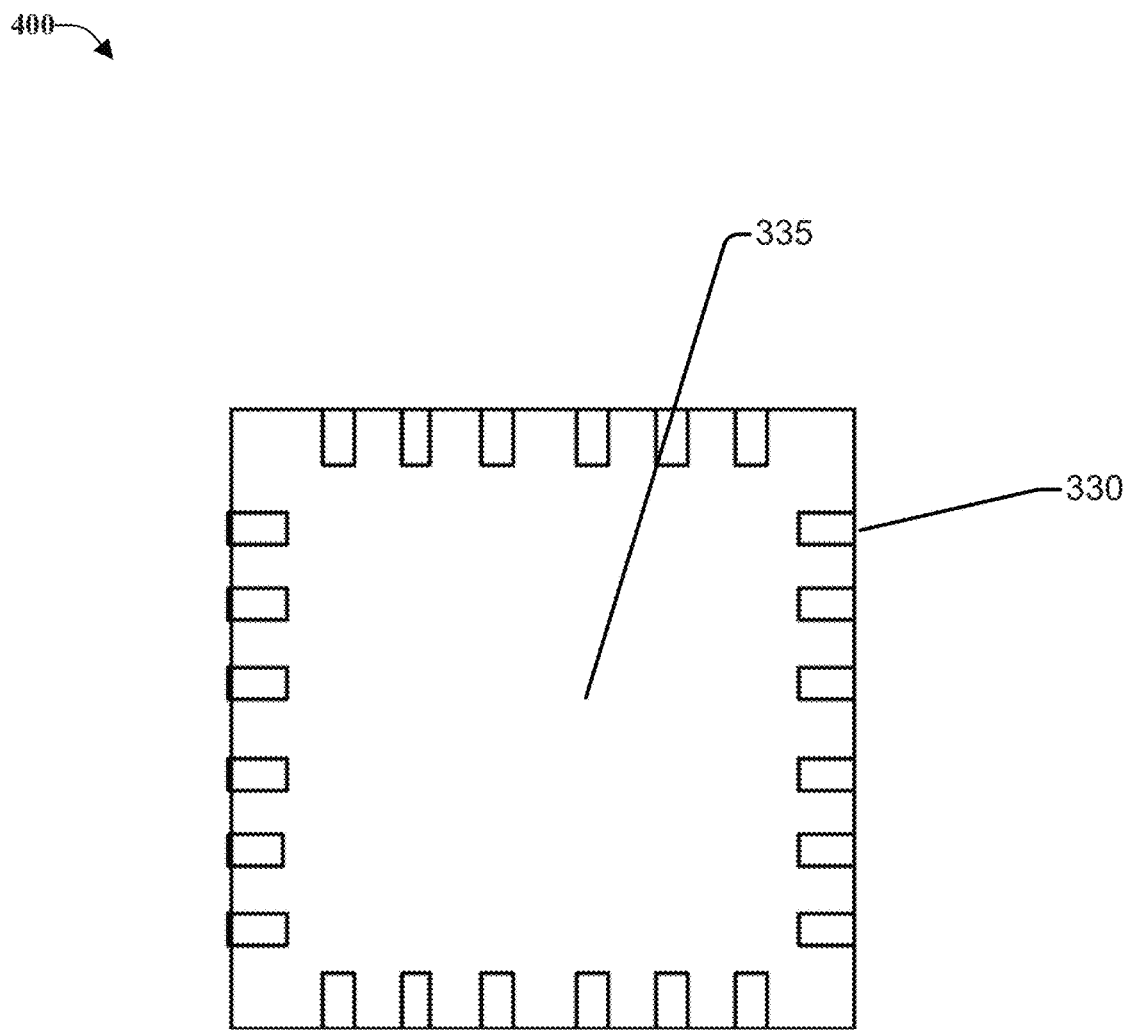

FIGS. 3 and 4 illustrate different views of the components of an example system that can facilitate packaging a sensor, in accordance with one or more embodiments, with FIG. 3 illustrating a non-limiting cross-sectional diagram of an example 300 of sensor die 110 packaged in lead frame 330 with die pad component 120, and FIG. 4 depicting a non-limiting example underside view 400 of example 300, in accordance with one or more embodiments. For purposes of brevity, description of like elements and/or processes employed in other embodiments is omitted.

Example 300 includes sensor die 110 vertically stacked on die pad component 120, with this combination of components packaged in lead frame 330. To describe different features with example 300, some sides of depicted components are labeled, e.g., sensor die 110 includes first sensor surface 315 opposite to second sensor surface 317, die pad component 120 includes first pad surface 325 opposite to second pad surface 334, and lead frame 330 includes a first frame surface 332 opposite to a second frame surface 335.

Some exemplary embodiments are now discussed with the parts of example 300 discussed above. In one or more embodiments of an example apparatus, sensor die 110 can comprise first sensor surface 315 and second sensor surface 317 opposite to first sensor surface 315, and die pad component 120 that includes a first pad surface 325 and second pad surface 334 opposite to first pad surface 325, with sensor die 110 being vertically stacked with the die pad component 120, and with second sensor surface 317 being oriented toward first pad surface 325. Example 300 can further include, lead frame 330 that includes first frame surface 332 and second frame surface 335 opposite to first frame surface 332, with die pad component 120 being vertically stacked with lead frame 330, with second pad surface 334 being, in some examples, oriented toward first frame surface 332.

It is illustrative to contrast FIGS. 3 and 4 to FIGS. 1 and 2 discussed above. For example, as depicted in FIG. 3, the cross section view of lead frame 330 includes die pad exposure region 180 replaced with a solid line that can indicate a barrier between second pad surface 334 of die pad component 120 and external exposure of die pad component 120, this barrier being, for example, part of lead frame 330. In one or more embodiments, to generate lead frame 330, a design of lead frame 130 can be modified to as to remove all or part of an opening for die pad exposure region 180. Thus, as depicted, in this example lead frame 330, second pad surface 334 of die pad component 120 abuts first frame surface 332 of lead frame 130, with lead frame 130 having a solid barrier between first frame surface 332 abutting an external surface, e.g., a PCB (not shown).

Returning to the benefits and operation of one or more embodiments, as noted above, IC packages that have similarities to those depicted in FIGS. 1-4 (e.g., stacked layers of components adhered to each other and lead frame 130) can be subject to delamination in some circumstances. One or more embodiments can reduce the likelihood of certain typed of delamination.

Considering delamination in additional detail, during device testing or use, sensor die 110 and die pad component 120 can undergo regular and irregular cycles of temperature change. As would be appreciated by one having skill in the relevant art(s), given the disclosure herein, temperature cycling can cause thermomechanical stresses at different parts of the packaged sensor die 110. Example stress points include the interface of second sensor surface 317 and first pad surface 325, as well as interface points between the packaged elements and lead frame 130. In some circumstances, the materials used in the different layers can augment these stresses, e.g., dissimilar materials can have different coefficients of thermal expansion (CTEs) that can cause expansion and contraction of materials at different rates. Some fabrication features can aggravate these temperature changes, e.g., the encapsulation of elements described with FIGS. 5 and 6 below.

Fatigue caused by repeated instances of these stresses can cause the delamination of packaged elements, as discussed above. It should be noted that delamination causing structural failure of the packaged IC represents an extreme failure caused by delamination, and one or more embodiments can reduce the likelihood of lesser failures caused by delamination as well.

Another factor that that can aggravate the thermomechanical stresses discussed above, is moisture inside of lead frame 330, e.g., moisture that ingressed into lead frame 330 packaging. One way that moisture can ingress is through exposed die pad component 120 being exposed, e.g. through an opening in die pad exposure region 180 discussed above. In some circumstances the aggravated stresses from moisture can be caused by pressure built-up from internal moisture being vaporized, e.g., during solder reflow at qualification and other times.

To address these example causes of delamination, one or more embodiments can be based on an evaluation of potential heat dissipation requirements of the packaged elements to determine whether a reduction in thermal conductivity (e.g., between die pad component 120 and the external environment) could be advantageously built into the design of the packaged IC sensor. For example, in some implementations of sensor die 110 (e.g., using MEMS sensor components, discussed below), can have lower power dissipation than other implementations, e.g., less heat is generated by operation than other implementations.

When this assessment that a lower amount of heat is generated is considered along with the potential for delamination based on thermomechanical forces (e.g., predicted temperature cycling), one or more embodiments can utilize the arrangement depicted in FIGS. 3 and 4, e.g., to increase the thermal isolation of die pad component 120 from external temperature fluctuations by, e.g., by physically isolating die pad component 120. With the physical isolation of die pad component 120, the ingress of moisture and impurities through die pad exposure region 180 can also be reduced. Based at least on this thermal isolation of die pad component 120, and the prevention on moisture ingress, one or more embodiments can reduce the likelihood of the types of delamination discussed above.

Figure 5:
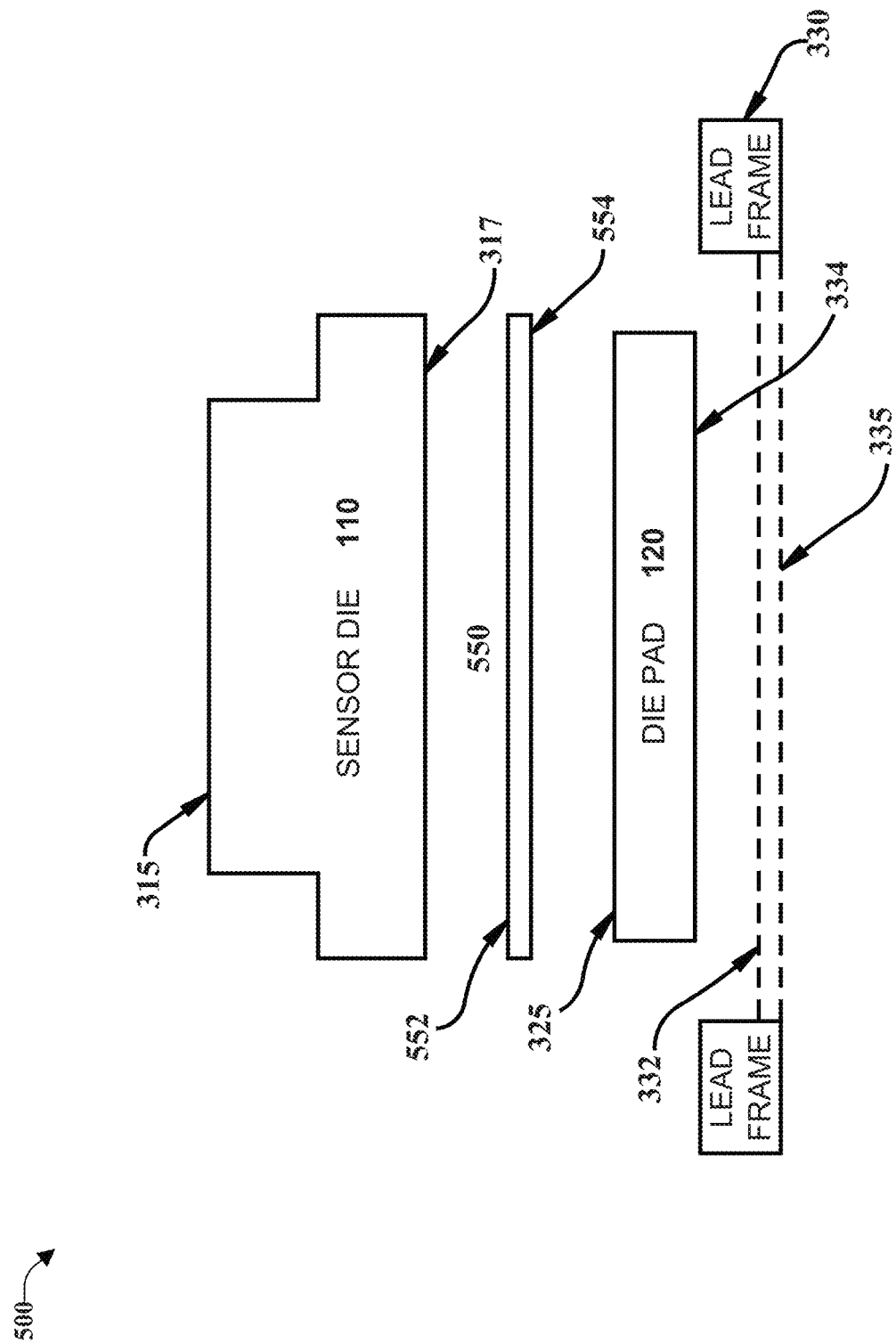
FIG. 5 depicts a non-liming, expanded cross-section view of an example of a sensor die packaged in a lead frame with a die pad, in accordance with one or more embodiments.

FIG. 5 depicts a non-liming, expanded cross-section view of an example 500 of sensor die 110 packaged in lead frame 330 with die pad component 120, in accordance with one or more embodiments. For purposes of brevity, description of like elements and/or processes employed in other embodiments is omitted. Expanding on example 300 of FIGS. 3 and 4, example 500 of FIG. 5 further includes bonding layer 550 disposed between second sensor surface 317 and first pad surface 325.

In one or more embodiments, bonding layer 550 can include different bonding elements, including, but not limited to, a bonding film, bonding paste, a non-conductive bonding element, and a conductive bonding element. In an exemplary embodiments, bonding layer 550 can be a die attached film (DAF) adhesive, e.g., attaching first bonding surface 552 to second sensor surface 317. Some characteristics of DAF that can be advantageous for one or more embodiments include, particularly for high tungsten (Tg) DAF, being relatively insensitive to delamination, e.g., further reducing the likelihood of delamination by one or more embodiments.

Upon assembly, second bonding layer 554 can be bonded to first pad surface 325, e.g., to affix sensor die 110 to die pad component 120. Additional details about bonding layer 550 are provided below with the discussion of different elements of sensor die 110.

Figure 6:
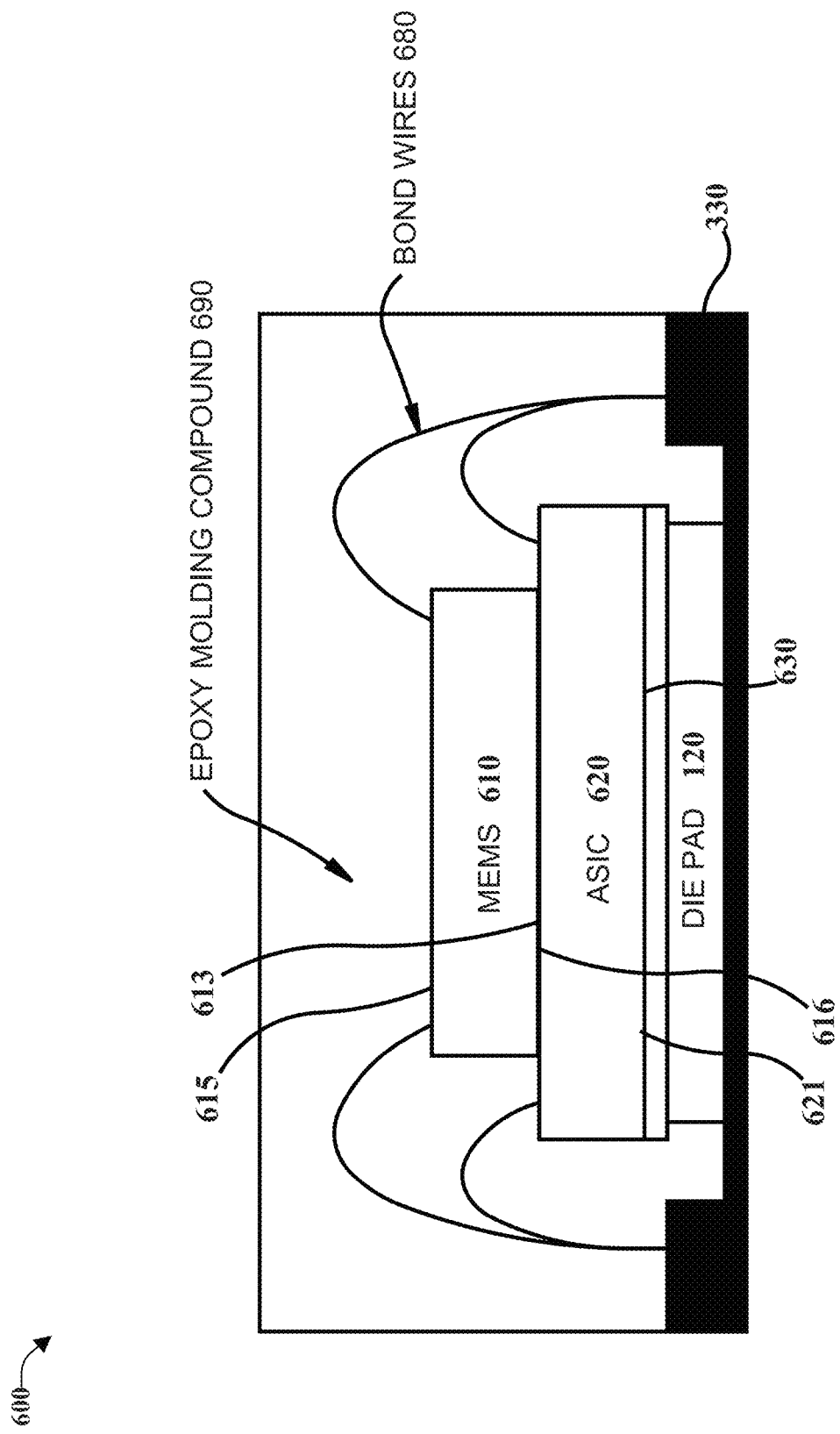
FIG. 6 depicts additional structural aspects of an example implementation of the IC packages depicted in FIGS. 1-5, in accordance with one or more embodiments.

FIG. 6 depicts additional structural aspects of an example implementation of the IC packages depicted in FIGS. 1-5, in accordance with one or more embodiments. For purposes of brevity, description of like elements and/or processes employed in other embodiments is omitted. In one or more embodiments, as depicted in FIG. 6, MEMS component 610 is coupled to ASIC 620. In additional details depicted, wire bond 660 can couple lead frame 130 to MEMS component 610 and ASIC 620.

As depicted, in some implementations, sensor die 110 can comprise MEMS component 610 and ASIC 620. In one or more embodiments, a signal generated by MEMS component 610 can be communicated to ASIC 620 for processing, resulting in an output signal. Considering these components in the context of the surfaces discussed in FIGS. 3-5, in some implementations, sensor die 110 can have first MEMS surface 615 and second MEMS surface 613 opposite to first MEMS surface 615, with the first sensor surface 315 of sensor die 110 corresponding to first MEMS surface 615. In the additional embodiments, an application-specific integrated circuit (ASIC) 620 component can include first ASIC surface 616 and second ASIC surface 621 opposite to first ASIC surface 616, with MEMS component 610 being vertically stacked with ASIC 620, with second MEMS surface 613 oriented toward first ASIC surface 616, and with second sensor surface corresponding to the second ASIC surface 621. Returning to bonding layer 550 discussed above, it should be noted that DAF can be attached to ASIC 620 at the first stage of assembly, e.g., DAF being added to an uncut wafer of ICs before the wafer saw stage.

ASIC 620 can include circuit components and connections to facilitate processing and generating output based on the signal generated by MEMS component 610. Example MEMS components 610 that can be incorporated in one or more embodiments of sensor die 110 can include MEMS sensors, which can include, but are not limited to, the MEMS gyroscope and MEMS accelerometer discussed with FIG. 3 above, as well as MEMS acoustic sensors, MEMS condenser sensors (e.g., a condenser microphone), electret sensors (e.g., an electret condenser microphone (ECM)), a capacitive sensor, and a capacitive antenna. As used herein, circuit can refer to any analog and/or digital based device, that include circuitry for performing functions associated with embodiment, including but not limited to, resistors, capacitors, transistors, diodes, inductors, memory, and programmable devices.

As depicted in FIG. 6, a gap between the lead frame 130 and sensor die 110 can be bridged with bond wires 680 attached to lead frame 330. In different implementations, bond wires 680 can be formed from various materials, including but not limited to, gold, copper, aluminum, and alloys thereof. After assembly of the components inside lead frame 330, sensor die 110, bond wires 680, and parts of lead frame 330 can be encapsulated in a molding compound, e.g., epoxy molding compound 690.

As noted above, this encapsulation can in some circumstances further aggravate thermo mechanical stresses, e.g., by reducing heat dissipation. In one or more embodiments however, encapsulation can be used to further isolate components from potentially damaging changes in temperature. For example, although FIG. 6 depicts second pad surface 334 of die pad component 120 abutting first frame surface 332 (discussed with FIG. 5 above), in one or more embodiments, die pad component 120 can be disposed with a space filled with epoxy molding compound 690 between second pad surface 334 and first frame surface 332, e.g., as discussed with FIG. 7 below.

Figure 7:
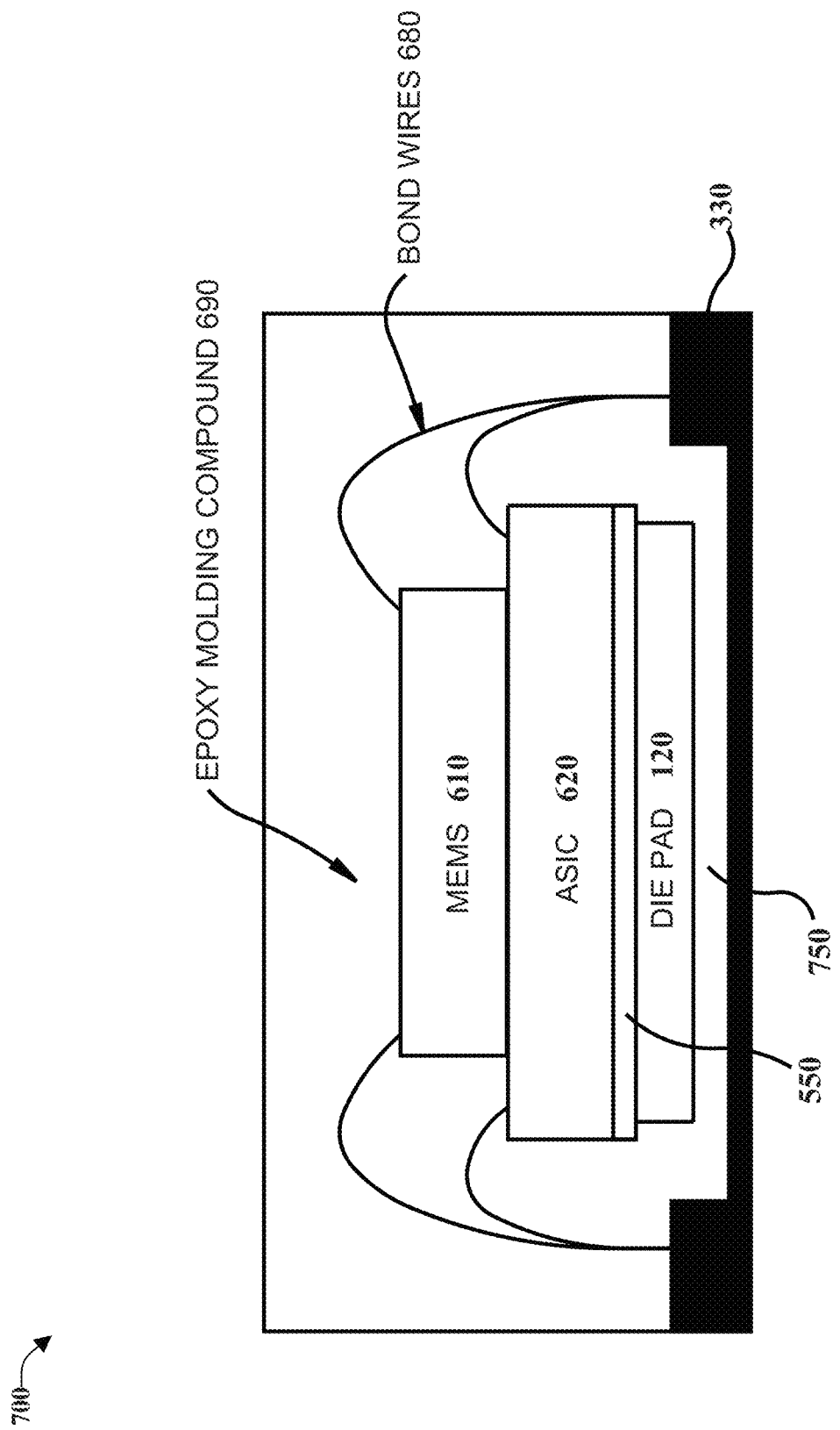
FIG. 7 illustrates a non-liming, cross-section view of an example of an IC package designed to reduce delamination of components, in accordance with one or more embodiments.

FIG. 7 illustrates a non-liming, cross-section view of an example 700 of an IC package designed to reduce delamination of components, in accordance with one or more embodiments. For purposes of brevity, description of like elements and/or processes employed in other embodiments is omitted.

In one or more embodiments, lead frame 330 can be a lead frame component (e.g., lead frame 130) without an opening to expose die pad component 120. Die pad component 120 is depicted as bonded with bonding layer 550 to a sensor die (e.g., sensor die 110) that includes MEMS component 610 bonded to ASIC 620.

It should be noted that, during assembly of the IC package of example 700, a space 750 has been left between die pad component 120 and lead frame 330. In one or more embodiments, this arrangement of this positioning of die pad component 120 in relation to lead frame 330 can be termed a lead frame with a reversed down set die pad (also termed a die pad that is recessed inversely). In one or more embodiments, this space 750 can facilitate a full encapsulation of the components packaged by lead frame 330, e.g., by epoxy molding compound 690.

It would be appreciated by one having skill in the relevant art(s), given the description herein, that the depicted full encapsulation can, in some circumstances, further reduce the likelihood of delamination, e.g., at least by the thermostructural and moisture stresses described above.

Figure 8:
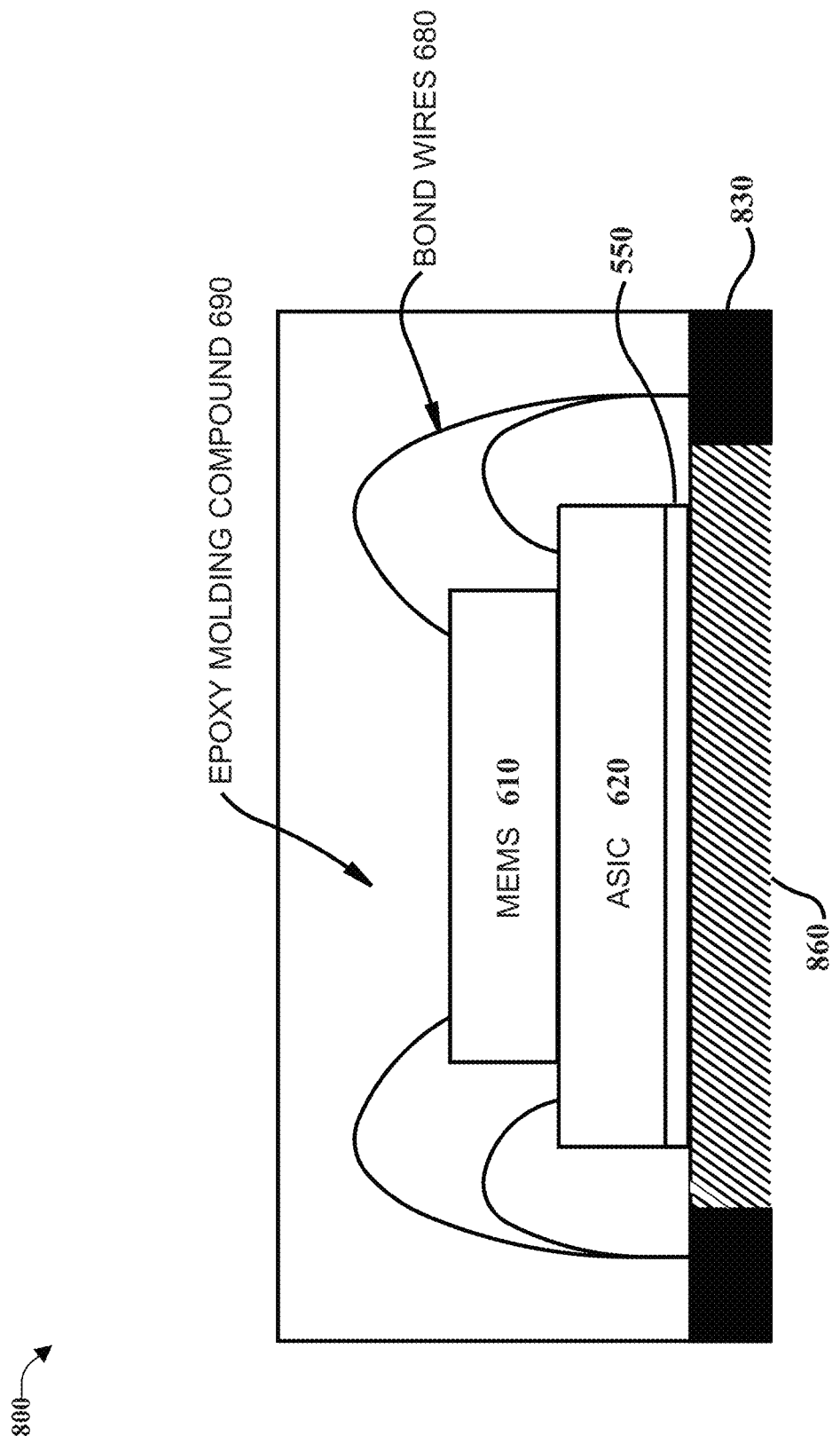
FIGS. 8 and 9 illustrate an example of, and alternative approach to, sensor die packaging, in accordance with one or more embodiments. For purposes of brevity, description of like elements and/or processes employed in other embodiments is omitted.
Figure 9:
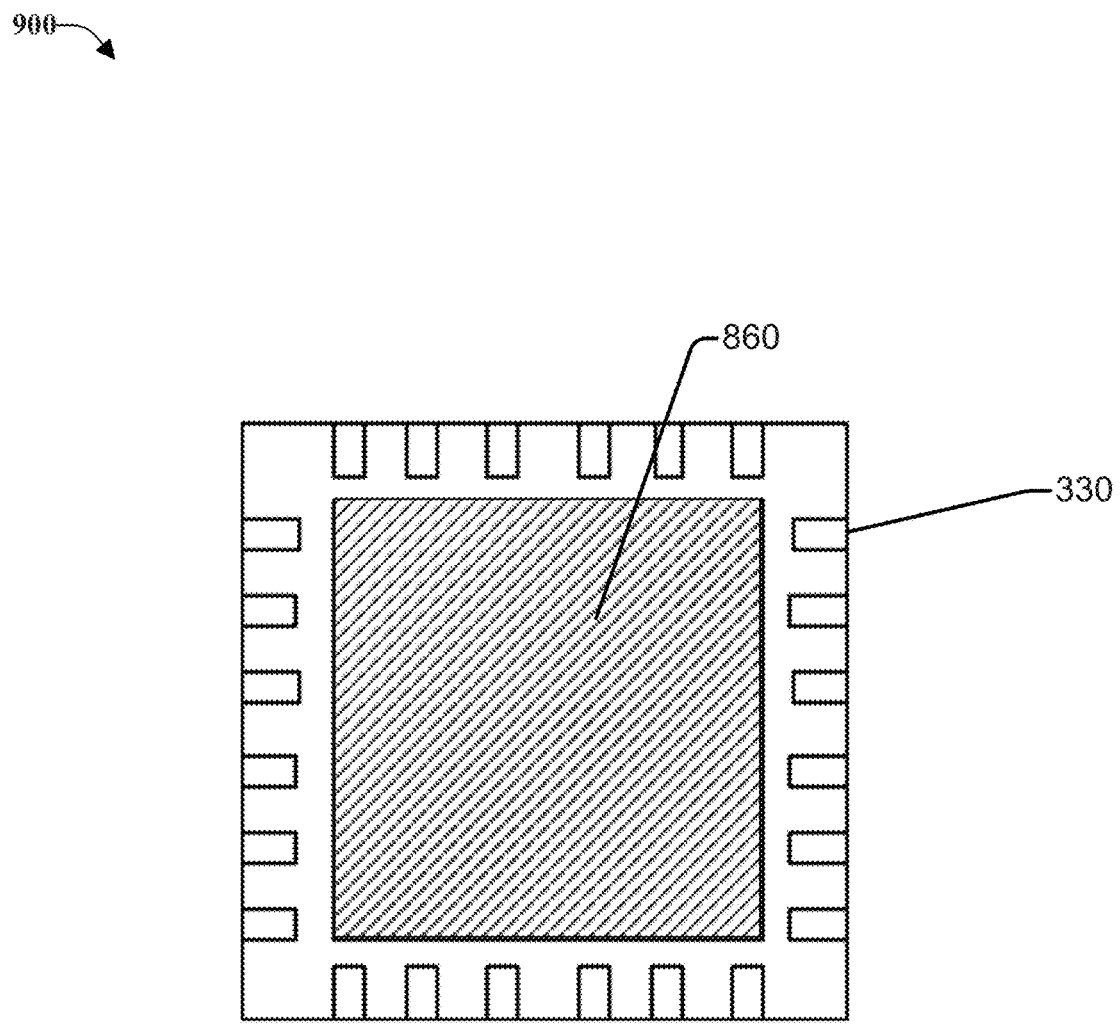

FIGS. 8 and 9 illustrate an example 800 of and alternative approach to sensor die packaging, in accordance with one or more embodiments. For purposes of brevity, description of like elements and/or processes employed in other embodiments is omitted.

For consideration of these alternative approaches, it should be noted that, in some circumstances, some conventional lead frames (e.g., with an exposed die pad component) are manufactured to have the exposed die pad component attached as a part of the lead frame, and other components can be affixed to the die pad. In alternative embodiments described above, the design and manufacture of a lead frame (e.g., lead frame 330 of FIG. 3) can be modified to have a different structure, e.g., with no exposure of a die pad component.

In another alternative approach, discussed below, instead of a redesigned, differently manufactured lead frame, a conventional lead frame (e.g., with a pre-placed, exposed die pad component) can used, and altered during the implementation process to have some of the characteristics of embodiments described below. This alteration can occur at different times, with an exemplary embodiment being performed during the assembly of the packaged IC. Thus, in this example, instead of using a lead frame, such as lead frame 330, without an opening for exposure of die pad, it could be advantageous to use a lead frame 830 with a die pad already disposed in an exposed position (not shown), e.g., similar to die pad exposure region 180 described with FIG. 1. In one approach to manufacturing one or more embodiments, sensor die 110 can be affixed to a die pad component of lead frame 830 (not shown), and other manufacturing processes can be performed, then an extra etching process can be performed that removes the die pad component from lead frame 830, while leaving other components remaining.

One having skill in the relevant art(s), given the description herein, would appreciate different actions that can be performed to assemble sensor die components and lead frame 830 into a packaged IC. In one or more embodiments, during the assembly, to facilitate removal of the die pad component as described above, a chemical etching process can be added to the assembly process that can remove the die pad from lead frame 830. In some implementations, this etching step can be performed after other components have been placed, e.g., after MEMS 610 is vertically stacked on ASIC 620, and after these components have been bonded to the die pad, with the additional etching process being designed to remove the die pad, while not affecting lead frame 830, ASIC 620, or any other components. In an exemplary embodiment, the added etching can be performed during the second-stage of assembly, e.g., after deflashing and de-burring, but before laser marking of components. One having skill in the relevant art(s), given the description herein, would appreciate that implementation-specific details (e.g., components packaged, materials used) can cause another point in the assembly process to be advantageous selected for this extra etching.

Returning to the results of the etching process, as noted above, in one or more embodiments, the etching process can be designed to remove the die pad component, while not affecting other components. An approach that can be used to facilitate this targeted etching can involve the use of bonding layer 550. As noted above, bonding layer 550 can be implemented using die attached film (DAF) adhesive. In some circumstances, removal of the die pad by the additional etching can expose the DAF adhesive. For example, shaded region 860 corresponding to an empty region that can remain after the additional etching process. Different benefits can result from this included empty region.

For example, this empty region can further reduce the stresses to which sensor die 110 is exposed in one or more embodiments, because the CTE of this space (e.g., including the DAF and epoxy molding compound discussed above)

can be less than the removed die pad component 120. Thus, in these alternative embodiments, the external stresses that can cause delamination of the packaged IC can also be mitigated, with an additional advantage over other embodiments that a conventional lead frame 830 can be used.

Figure 10:
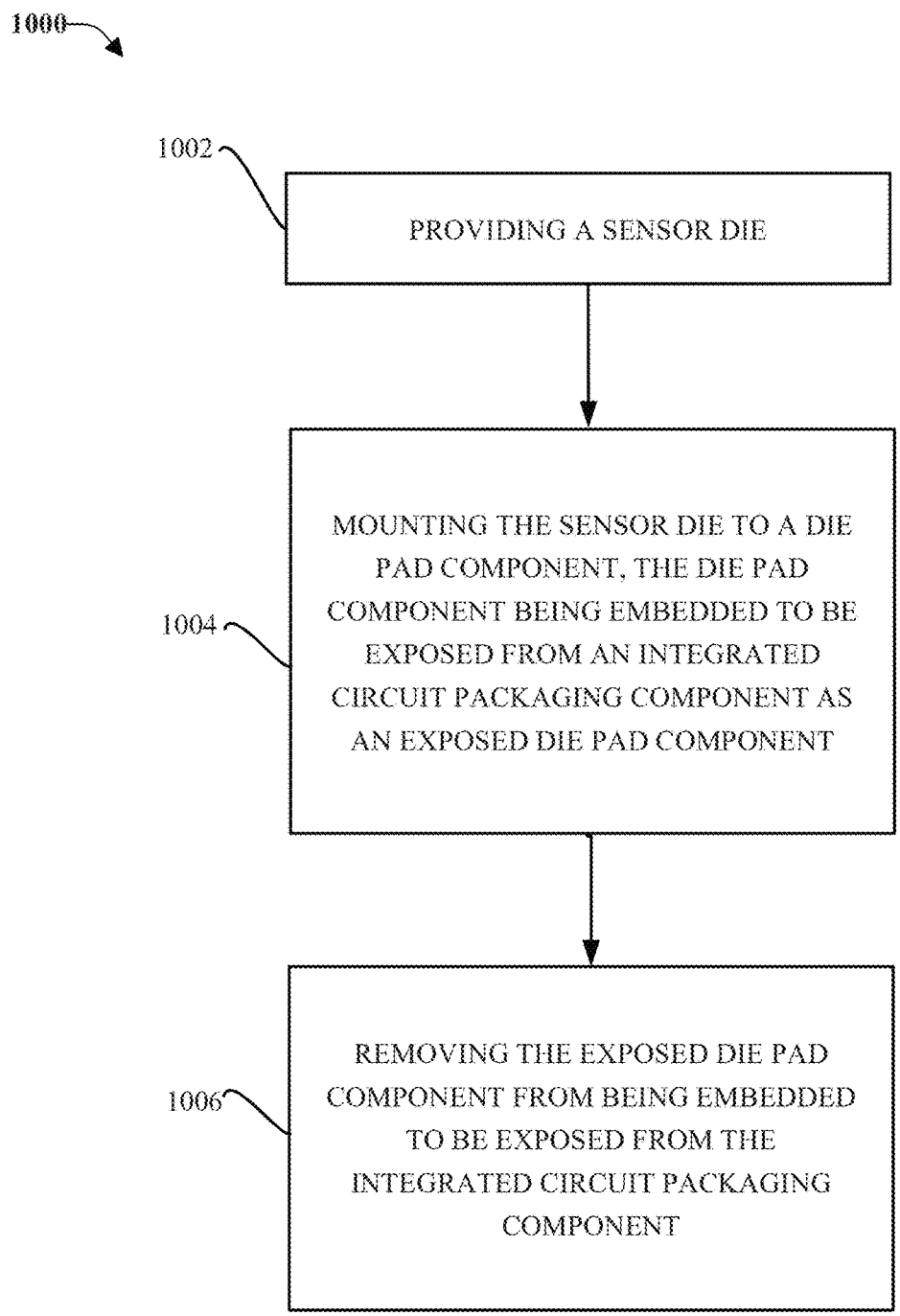
FIG. 10 depicts a flow diagram of an example method that can form or implement a sensor with a reduced likelihood of delamination in accordance with one or more embodiments.

FIG. 10 depicts a flow diagram of an example method 1000 that can form or implement a sensor with a reduced likelihood of delamination in accordance with one or more embodiments.

It is to be appreciated and understood that components (e.g., die pad component, MEMS component, ASIC component, lead frame component, and bonding layer), as described with regard to a particular device, system, or method, can comprise the same or similar functionality as respective components (e.g., respectively named components or similarly named components) as described with regard to other devices, systems, or methods disclosed herein.

At 1002, method 1000 can comprise providing a sensor die. For example, a sensor die 110 can be provided, as depicted in FIG. 1. At 1004, method 1000 can comprise mounting the sensor die to a die pad component, the die pad component being embedded to be exposed from an integrated circuit packaging component as an exposed die pad component. For example, sensor die 110 can be mounted to die pad component 120, with the die pad component being embedded to be exposed from an integrated circuit packaging component (e.g., lead frame 130) as an exposed die pad component 120.

At 1006, method 1000 can comprise removing the exposed die pad component from being embedded to be exposed from the integrated circuit packaging component. For example, the exposed die pad component 120 can be remove from being embedded to be exposed from lead frame 130 by an additional etching process performed after assembly of other parts of the IC package. The etching can result in a region 860, that can correspond to an empty area, e.g., for placement of epoxy molding compound 690.

While the various embodiments are susceptible to various modifications and alternative constructions, certain illustrated implementations thereof are shown in the drawings and have been described above in detail. It should be understood, however, that there is no intention to limit the various embodiments to the specific forms disclosed, but on the contrary, the intention is to cover all modifications, alternative constructions, and equivalents falling within the spirit and scope of the various embodiments. Moreover, while the various embodiments are susceptible to various modifications and alternative constructions, certain illustrated implementations thereof are shown in the drawings and have been described above in detail. It should be further understood, however, that there is no intention to limit the various embodiments to the specific forms disclosed, but on the contrary, the intention is to cover all modifications, alternative constructions, and equivalents falling within the spirit and scope of the various embodiments.

In this regard, while the disclosed subject matter has been described in connection with various embodiments and corresponding Figures, where applicable, it is to be understood that other similar embodiments can be used or modifications and additions can be made to the described embodiments for performing the same, similar, alternative, or substitute function of the disclosed subject matter without deviating therefrom. Therefore, the disclosed subject matter should not be limited to any single embodiment described herein, but rather should be construed in breadth and scope in accordance with the appended claims below.

What has been described above includes examples of the embodiments of the subject disclosure. It is, of course, not possible to describe every conceivable combination of configurations, components, and/or methods for purposes of describing the claimed subject matter, but it is to be appreciated that many further combinations and permutations of the various embodiments are possible. Accordingly, the claimed subject matter is intended to embrace all such alterations, modifications, and variations that fall within the spirit and scope of the appended claims. While specific embodiments and examples are described in subject disclosure for illustrative purposes, various modifications are possible that are considered within the scope of such embodiments and examples, as those skilled in the relevant art can recognize.

As used in this application, the terms "component," "module," "device" and "system" are intended to refer to a computer-related entity, either hardware, a combination of hardware and software, software, or software in execution. As one example, a component or module can be, but is not limited to being, a process running on a processor, a processor or portion thereof, a hard disk drive, multiple storage drives (of optical and/or magnetic storage medium), an object, an executable, a thread of execution, a program, and/or a computer. By way of illustration, both an application running on a server and the server can be a component or module. One or more components or modules scan reside within a process and/or thread of execution, and a component or module can be localized on one computer or processor and/or distributed between two or more computers or processors.

As used herein, the term to "infer" or "inference" refer generally to the process of reasoning about or inferring states of the system, and/or environment from a set of observations as captured via events, signals, and/or data. Inference can be employed to identify a specific context or action, or can generate a probability distribution over states, for example. The inference can be probabilistic—that is, the computation of a probability distribution over states of interest based on a consideration of data and events. Inference can also refer to techniques employed for composing higher-level events from a set of events and/or data. Such inference results in the construction of new events or actions from a set of observed events and/or stored event data, whether or not the events are correlated in close temporal proximity, and whether the events and data come from one or several event and data sources.

In addition, the words "example" or "exemplary" is used herein to mean serving as an example, instance, or illustration. Furthermore, the word "exemplary" and/or "demonstrative" is used herein to mean serving as an example, instance, or illustration. For the avoidance of doubt, the subject matter disclosed herein is not limited by such examples. In addition, any aspect or design described herein as "exemplary" and/or "demonstrative" is not necessarily to be construed as preferred or advantageous over other aspects or designs, nor is it meant to preclude equivalent exemplary structures and techniques known to those of ordinary skill in the art.

As used in this application, the term "or" is intended to mean an inclusive "or" rather than an exclusive "or". That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims should generally be construed to mean "one or more" unless specified otherwise or clear from context to be directed to a singular form.

In addition, while an aspect may have been disclosed with respect to only one of several embodiments, such feature may be combined with one or more other features of the other embodiments as may be desired and advantageous for any given or particular application. Furthermore, to the extent that the terms "includes," "including," "has," "contains," variants thereof, and other similar words are used in either the detailed description or the claims, these terms are intended to be inclusive in a manner similar to the term "comprising" as an open transition word without precluding any additional or other elements.

What is claimed is:

1. A sensor, comprising:
    a sensor die comprising a first sensor surface and a second sensor surface opposite to the first sensor surface, wherein the sensor die comprises a micro-electrical-mechanical systems (MEMS) die comprising a first MEMS surface and a second MEMS surface opposite to the first MEMS surface, wherein the first sensor surface comprises the first MEMS surface;
    an application-specific integrated circuit (ASIC) component comprising a first ASIC surface and a second ASIC surface opposite to the first ASIC surface, wherein the MEMS die is vertically and directly stacked with the ASIC component, with the second MEMS surface oriented toward the first ASIC surface, and wherein the second sensor surface comprises the second ASIC surface;
    a die pad component comprising a first pad surface and a second pad surface opposite to the first pad surface, wherein the sensor die is vertically stacked with the die pad component, with the second sensor surface oriented toward the first pad surface; and
    a lead frame component comprising a first frame surface and a second frame surface opposite to the first frame surface, wherein the die pad component is vertically stacked with the lead frame component, wherein the second pad surface is oriented toward the first frame surface, wherein the second pad surface is isolated from the second frame surface, and wherein the lead frame component is electrically connected to the sensor die, wherein the sensor die and the first frame surface of the lead frame component are encapsulated by molding component, and wherein the second sensor surface of the sensor die and the second frame surface of the lead frame component are exposed to outside of the sensor package.

2. The sensor of claim 1, wherein the second pad surface is isolated from the second frame surface based on being at least partially encapsulated in a molding compound.

3. The sensor of claim 1, wherein the second pad surface is isolated from the second frame surface based on the second pad surface not being exposed outside of the lead frame component.

4. The sensor of claim 1, wherein the second pad surface is isolated from the second frame surface to a degree selected based on an isolation required to prevent delamination of the die pad component.

5. The sensor of claim 1, wherein the MEMS die comprises a MEMS accelerometer or a MEMS gyroscope.

6. The sensor of claim 1, wherein the second frame surface is for orientating towards, and mounting to, a circuit board.

7. The sensor of claim 1, wherein the second pad surface is thermally isolated from the second frame surface.

8. The sensor of claim 1, wherein the second pad surface is moisture isolated from the second frame surface.

9. The sensor of claim 1, wherein the second pad surface is electrically isolated from the second frame surface.

10. The sensor of claim 1, further comprising bond wires, wherein the bond wires electrically couple the sensor die to the lead frame component.

11. The sensor of claim 1, wherein the sensor die and the die pad component are packaged in a circuit package by the lead frame component.

12. The sensor of claim 1, wherein the sensor die and the die pad component are mounted to the lead frame component by a material comprising a molding compound.

13. The sensor of claim 12, wherein the molding compound mounts the die pad component to the lead frame component by factors comprising disposal of the molding compound between the second pad surface and the first frame surface, and wherein the second pad surface is isolated from the second frame surface based on the molding compound.

14. The sensor of claim 1, wherein the die pad component is removed from the sensor based on an opening in the lead frame component and an etching process.

15. The sensor of claim 14, wherein the removal of the die pad component exposes the second sensor surface to an outside of the sensor.

16. The sensor of claim 1, wherein the die pad component is encapsulated by the lead frame component, resulting in an unexposed die pad component.

17. The sensor of claim 1, wherein the second pad surface is isolated from the second frame surface to reduce exposure of the die pad component to external influence.

18. The sensor of claim 17, wherein the external influence comprises any of humidity and temperature.

19. The sensor of claim 1, further comprising an adhesive layer disposed between the second sensor surface and the first pad surface, resulting in the sensor die being affixed to the die pad component with the adhesive layer.

* * * * *